(12) United States Patent
Pan

(10) Patent No.: US 9,455,321 B1
(45) Date of Patent: Sep. 27, 2016

(54) METHOD FOR FABRICATING SEMICONDUCTOR DEVICE

(71) Applicant: UNITED MICROELECTRONICS CORP., Hsin-Chu (TW)

(72) Inventor: Chen-Wei Pan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/704,984

(22) Filed: May 6, 2015

(51) Int. Cl.
| | |
|---|---|
| *H01L 21/3205* | (2006.01) |
| *H01L 21/4763* | (2006.01) |
| *H01L 29/40* | (2006.01) |
| *H01L 21/02* | (2006.01) |
| *H01L 29/49* | (2006.01) |
| *H01L 21/324* | (2006.01) |

(52) U.S. Cl.
CPC ......... *H01L 29/401* (2013.01); *H01L 21/0228* (2013.01); *H01L 21/02164* (2013.01); *H01L 21/02532* (2013.01); *H01L 21/02595* (2013.01); *H01L 21/324* (2013.01); *H01L 29/4916* (2013.01)

(58) Field of Classification Search
CPC .................................................... H01L 29/401
USPC ........................................................ 438/591
See application file for complete search history.

(56) References Cited

U.S. PATENT DOCUMENTS

| | | | |
|---|---|---|---|
| 7,345,355 B2 | 3/2008 | Jain et al. | |
| 8,076,228 B2 * | 12/2011 | Berthold | H01L 21/26506 257/612 |
| 8,487,354 B2 | 7/2013 | Chen et al. | |
| 2011/0227142 A1 * | 9/2011 | Ramaswamy | B82Y 10/00 257/325 |
| 2013/0313657 A1 * | 11/2013 | Tong | H01L 21/02181 257/411 |
| 2013/0344692 A1 * | 12/2013 | Triyoso | H01L 21/3105 438/591 |
| 2014/0361385 A1 * | 12/2014 | Zaka | H01L 21/265 257/412 |
| 2015/0179439 A1 * | 6/2015 | Huang | H01L 21/28255 438/783 |
| 2015/0228778 A1 * | 8/2015 | Oh | H01L 29/78 257/411 |

OTHER PUBLICATIONS

Y.-J. Lee et al, A Novel Junctionless FinFET Structure with Sub-5nm Shell Doping Profile by Molecular Monolayer Doping and Microwave Annealing, 2014 IEEE.

* cited by examiner

*Primary Examiner* — David S Blum
(74) *Attorney, Agent, or Firm* — Winston Hsu; Scott Margo

(57) ABSTRACT

A method for fabricating semiconductor device is disclosed. The method includes the steps of: providing a substrate; forming an interfacial layer on the substrate; coating a monolayer containing fluorine on the interfacial layer; and forming a gate layer on the interfacial layer.

5 Claims, 4 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of reducing flicker noise of a semiconductor device.

2. Description of the Prior Art

Low frequency, or 1/f noise (also referred to as flicker noise), is a dominant noise source in field-effect transistors (such as MOSFET devices). While not wishing to be bound by theory, the 1/f noise may be caused by carriers, such as electrons or holes, being transiently trapped in the gate dielectric and/or the interface between the gate dielectric and the channel of the transistor. The random translocation of carriers into traps or defect centers, such as silicon dangling bonds, into the gate dielectric and back into the channel, may cause the current through the transistor to fluctuate, which manifests as 1/f noise.

The push toward smaller and faster semiconductor devices has increased the need to reduce 1/f noise. The effect of 1/f noise may be partially reduced by using transistors having large device areas in the initial stages so that 1/f noise does not get amplified to the same extent as the signal in subsequent stages of an amplification circuit. This approach, however, may not prevent 1/f noise from being introduced at later amplification stages in the circuit where smaller transistors are used. Moreover, the dimensions to which such devices can be scaled down may be limited by the necessity for one or more large early stage transistors. Hence, there is a need for new approaches to reducing 1/f noise.

SUMMARY OF THE INVENTION

According to a preferred embodiment of the present invention, a method for fabricating semiconductor device is disclosed. The method includes the steps of: providing a substrate; forming an interfacial layer on the substrate; coating a monolayer containing fluorine on the interfacial layer; and forming a gate layer on the interfacial layer.

According to another aspect of the present invention, a method for fabricating semiconductor device is disclosed. The method includes the steps of: providing a substrate; forming a gate layer on the substrate; and coating a monolayer containing fluorine on the gate layer.

These and other objectives of the present invention will no doubt become obvious to those of ordinary skill in the art after reading the following detailed description of the preferred embodiment that is illustrated in the various figures and drawings.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
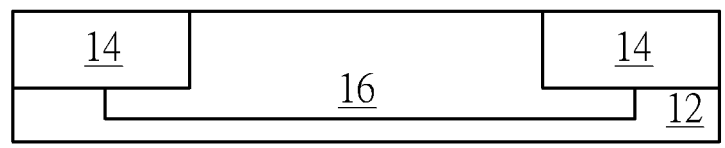
FIGS. 1-5 are perspective views illustrating a method for fabricating planar MOS transistor according to a first embodiment of the present invention.

Referring to FIGS. 1-5, FIGS. 1-5 are perspective views illustrating a method of fabricating planar metal-oxide semiconductor (MOS) transistor according to a first embodiment of the present invention. As shown in FIG. 1, a substrate 12 is first provided. The substrate 12 may be a silicon-containing substrate, such as a mono-crystalline silicon wafer or any wafer or substrate having a high silicon content. The substrate 12, for example, is silicon-based substrate, pure silicon substrate, silicon-on-insulator (SOI) substrate, germanium channel substrate, substrate having bulk strain, and substrate having crystallographic orientation.

Next, shallow trench isolations (STIs) 14 are formed in the substrate 12. In the embodiment shown, the STIs 14 are shown as trenches etched into the substrate 12 that have been filled with an insulating material such as $SiO_2$ or other suitable insulating material to insulate one transistor cell from adjacent transistor cells. In the embodiment shown, the STIs 14 are formed using a typical shallow trench isolation (STI) process. However, in other embodiments of the invention, STIs 14 may be formed otherwise, such as by a LOCOS process. Next, a well 16, such as p-type well is formed in the substrate 12. The p-type well may be formed by doping the substrate 12 with a p-type dopant, in which an example of a p-type dopant is boron.

Figure 2:
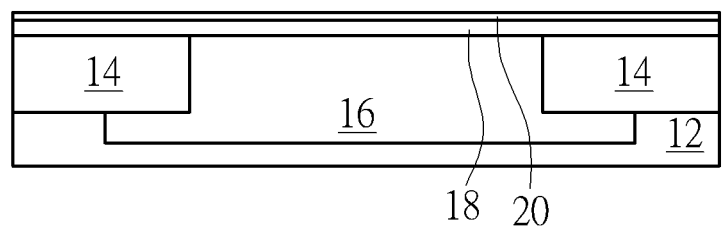

Next, as shown in FIG. 2, an interfacial layer 18 or gate dielectric material is formed over the substrate 12 and the STIs 14. The interfacial layer 18 is preferably composed of $SiO_2$, but could also be selected from the group consisting of SiN and SiON.

Next, a coating process is conducted to form a monolayer 20 containing fluorine on the interfacial layer 18. According to a preferred embodiment of the present invention, the coating process could be accomplished by either treating the substrate with chemical solution or performing an atomic layer deposition (ALD) process to form a monolayer 20 on the interfacial layer 18. It is to be noted that the precursor used for the chemical solution or the ALD process is selected from the group consisting of $CH_3FO_2$ and $C_2H_6FO_3P$. By exposing the surface of the interfacial layer 18 with the chemical molecules from the precursor, a monolayer 20 at least containing fluorine is coated on the surface of the interfacial layer 18 entirely.

Figure 3:
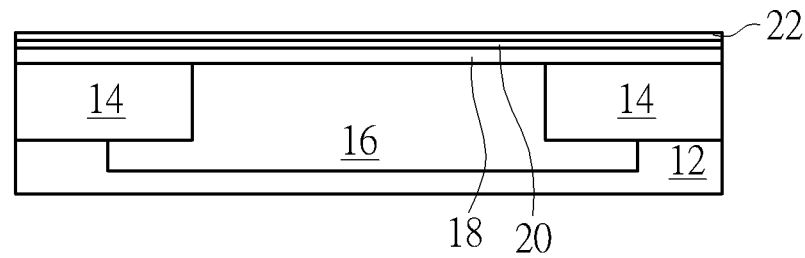

After the monolayer 20 is formed, as shown in FIG. 3, an optional high-k dielectric layer 22 having dielectric constant (k value) larger than 4 is formed on the monolayer 20 and the interfacial layer 18 depending on the scheme of the replacement metal gate (RMG) process being employed. For instance, if a high-k first approach from gate last process were employed as disclosed in this embodiment, a high-k dielectric layer 22 would be formed on the monolayer 20 before deposition of a gate layer on the substrate 12 and the high-k dielectric layer 22 in the metal gate structure formed afterwards would be I-shaped. If a high-k last approach from gate last process were employed, the high-k dielectric layer 22 would be formed after the deposition of gate layer and after the gate layer is patterned into a dummy gate structure, and the high-k dielectric layer in the metal gate structure formed afterwards would be U-shaped. The high-k dielectric layer 22 can be formed through an atomic layer deposition (ALD) process or a metal-organic chemical vapor deposition (MOCVD) process, but not limited thereto.

The material of the high-k dielectric layer 22 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

After high-k dielectric layer 22 is formed on the monolayer 20, an anneal process is conducted to eliminate the formation of lower-k dielectric materials and improve the electrical and physical characteristics of the high-k dielectric layer 22. According to an embodiment of the present invention, it would be also desirable to perform an extra anneal process after the aforementioned anneal process is completed.

Figure 4:
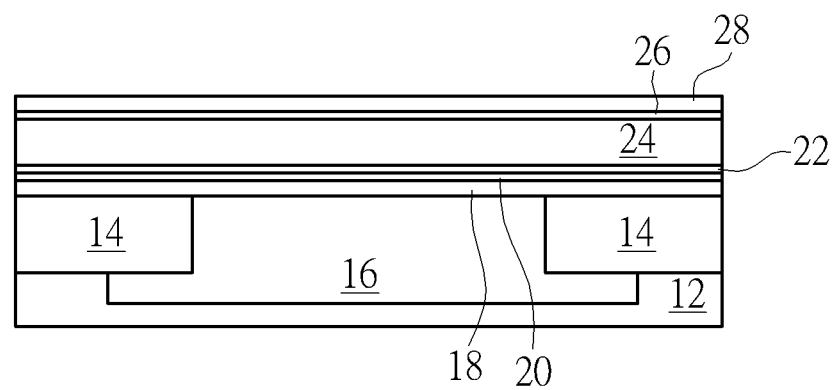

Next, as shown in FIG. 4, a gate layer 24 is deposited on the high-k dielectric layer 22, in which the gate layer 24 is composed of polysilicon or amorphous silicon. After the gate layer 24 is formed, another coating process is conducted to form a monolayer 26 containing fluorine on the gate layer 24.

Similar to the aforementioned coating process, the coating process at this stage could also be accomplished by either treating the gate layer 24 with chemical solution or performing an atomic layer deposition (ALD) process to form a monolayer 24 on the gate layer 24, in which the precursor used for the chemical solution or ALD process is selected from the group consisting of $CH_3FO_2$ and $C_2H_6FO_3P$. By exposing the surface of the gate layer 24 with the chemical molecules from the precursor, a monolayer 26 at least containing fluorine is formed on the surface of the gate layer 24. An anneal process is then conducted thereafter.

Next, a hard mask 28 is covered on the surface of the monolayer 26 and gate layer 24. According to an embodiment of the present invention, the hard mask 28 is selected from a group consisting of SiC, SiON, SiN, SiCN, and SiBN, but not limited thereto.

Figure 5:
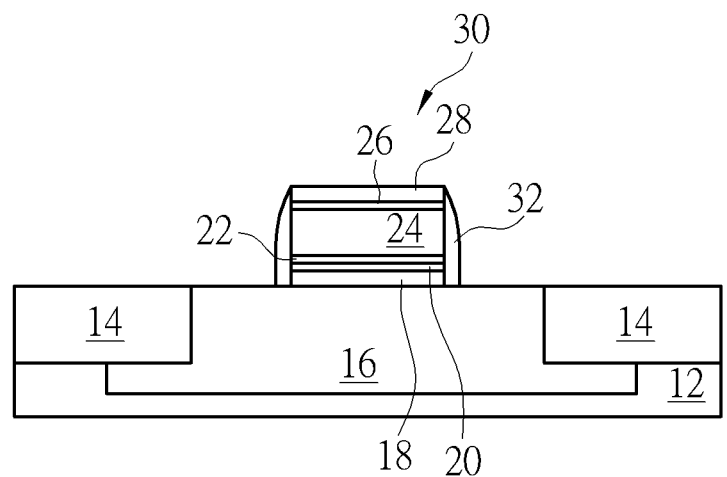

As shown in FIG. 5, the hard mask 28, monolayer 26, gate layer 24, high-k dielectric layer 22, monolayer 20, and interfacial layer 18 are then patterned to form a gate structure 30 on the substrate 12, and a spacer 32 is formed adjacent to the sidewalls of the gate structure 30. According to an embodiment of the present invention, another anneal process could be conducted after the hard mask 28 is formed on the monolayer 26 and before the formation of the gate structure 30. Elements including source/drain region, epitaxial layer, and silicides could be formed adjacent to the gate structure thereafter, and a RMG process could be carried out to transform the gate structure into a metal gate depending on the demand of the process. This completes the fabrication of a semiconductor device according to a first embodiment of the present invention.

Figure 6:
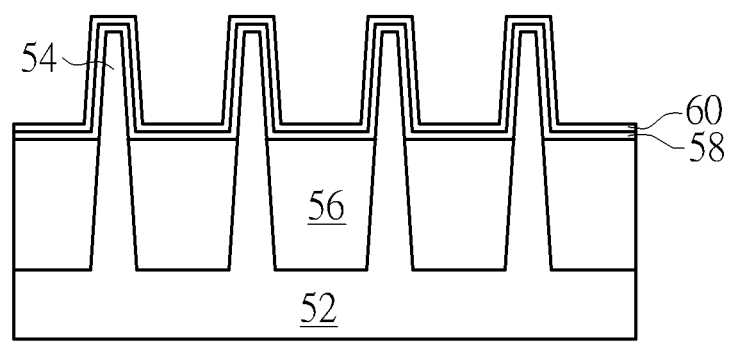
FIGS. 6-8 are perspective views illustrating a method for fabricating fin field effect transistor (FinFET) according to a second embodiment of the present invention.
Figure 7:
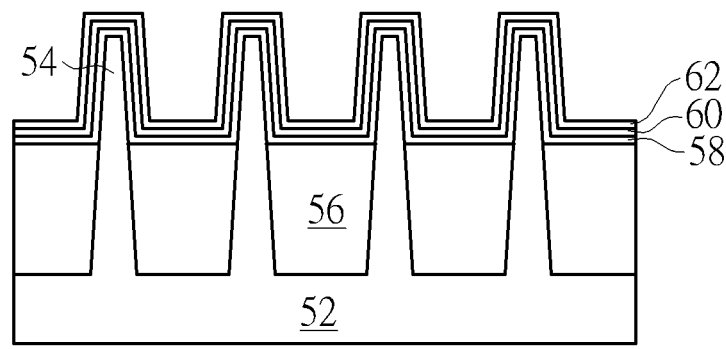
Figure 8:
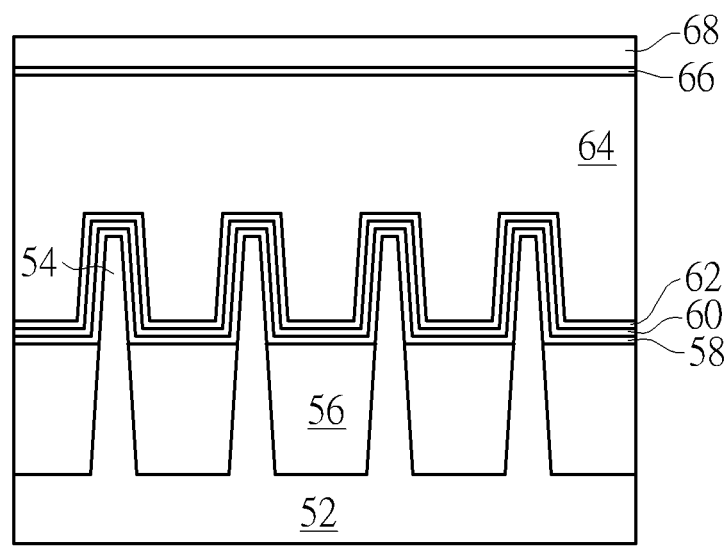

Referring to FIGS. 6-8, FIGS. 6-8 are perspective views illustrating a method of fabricating a fin field effect transistor (FinFET) according to a second embodiment of the present invention. As shown in FIG. 6, a substrate 52 is first provided, a plurality of fin-shaped structures 54 are formed on the substrate 52, and a shallow trench isolation (STI) 56 is formed around the fin-shaped structures 54. The substrate 52 may be a silicon-containing substrate, such as a monocrystalline silicon wafer or any wafer or substrate having a high silicon content. The substrate 52, for example, is silicon-based substrate, pure silicon substrate, silicon-on-insulator (SOI) substrate, germanium channel substrate, substrate having bulk strain, and substrate having crystallographic orientation.

The fin-shaped structures 54 of this embodiment are preferably obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate 52. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the underneath substrate 52, and through additional fin cut processes, desirable pattern structures, such as stripe patterned fin-shaped structures 54 could be obtained.

The fin-shaped structures 54 of this embodiment could also be obtained by first forming a patterned mask (not shown) on the substrate, 52, and through an etching process, the pattern of the patterned mask is transferred to the substrate 52 to form the fin-shaped structures 54. Moreover, the formation of the fin-shaped structures 54 could also be accomplished by first forming a patterned hard mask (not shown) on the substrate 52, and a semiconductor layer composed of silicon germanium is grown from the substrate 52 through exposed patterned hard mask via selective epitaxial growth process to form the corresponding fin-shaped structures 54. These approaches for forming the fin-shaped structures 54 are all within the scope of the present invention.

Next, an interfacial layer 58 or gate dielectric material is formed over the surface of fin-shaped structures 54 and the STI 56. The interfacial layer 58 is preferably composed of $SiO_2$, but could also be selected from the group consisting of SiN and SiON.

Next, a coating process is conducted to form a monolayer 60 containing fluorine on the interfacial layer 58. According to a preferred embodiment of the present invention, the coating process could be accomplished by either treating the substrate with chemical solution or performing an atomic layer deposition (ALD) process to form a monolayer 60 on the interfacial layer 58. Preferably, the precursor used for the chemical solution or the ALD process is selected from the group consisting of $CH_3FO_2$ and $C_2H_6FO_3P$. By exposing the surface of the interfacial layer 58 with the chemical molecules from the precursor, a monolayer 60 at least containing fluorine is formed on the surface of the interfacial layer 58.

After the monolayer 60 is formed, as shown in FIG. 7, an optional high-k dielectric layer 62 having dielectric constant (k value) larger than 4 is formed on the monolayer 60 and the interfacial layer 58 depending on the scheme of the replacement metal gate (RMG) process being employed. For instance, if a high-k first approach from gate last process were employed then a high-k dielectric layer 62 would be formed on the monolayer 60 before deposition of a gate layer on the substrate 52, whereas if a high-k last approach from gate last process were employed then the high-k dielectric layer 62 would be formed after the deposition of gate layer and after the gate layer is patterned into a dummy gate structure. The high-k dielectric layer 62 can be formed through an atomic layer deposition (ALD) process or a metal-organic chemical vapor deposition (MOCVD) process, but not limited thereto.

The material of the high-k dielectric layer 62 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

After high-k dielectric layer is formed on the monolayer 60, an anneal process is conducted to eliminate the formation of lower-k dielectric materials and improve the electrical and physical characteristics of the high-k dielectric layer 62. According to an embodiment of the present invention, it would be desirable to perform an additional anneal process after the aforementioned anneal process is completed.

Next, a gate layer 64 is deposited on the high-k dielectric layer 62 and covering the fin-shaped structures 54 entirely, in which the gate layer 64 is composed of polysilicon or amorphous silicon. After the gate layer 64 is formed, another coating process is conducted to form a monolayer 66 containing fluorine on the gate layer 64.

Similar to the aforementioned coating process, the coating process at this stage could also be accomplished by either treating the gate layer with chemical solution or performing an atomic layer deposition (ALD) process to form a monolayer 66 on the gate layer 64, in which the precursor used for the chemical solution or the ALD process is selected from the group consisting of $CH_3FO_2$ and $C_2H_6FO_3P$. By exposing the surface of the gate layer 64 with the chemical molecules from the precursor, a monolayer 66 at least containing fluorine is formed on the surface of the gate layer 64, and an anneal process is conducted thereafter.

Next, a hard mask 68 is covered on the surface of the monolayer 66. According to an embodiment of the present invention, the hard mask 68 is selected from a group consisting of SiC, SiON, SiN, SiCN, and SiBN, but not limited thereto.

The hard mask 68 monolayer 66, gate layer 64, high-k dielectric layer 62, monolayer 60, and interfacial layer 58 are then patterned to form a gate structure on the substrate 52 and fin-shaped structures 54, and a spacer is formed adjacent to the sidewalls of the gate structure. Similar to the aforementioned embodiment, another anneal process could be conducted after the hard mask 68 is formed on the monolayer 66 and before the formation of the gate structure. Elements including source/drain region, epitaxial layer, and silicides could be formed adjacent to the gate structure thereafter, and a RMG process could be carried out to transform the gate structure into a metal gate depending on the demand of the process. This completes the fabrication of a semiconductor device according to a second embodiment of the present invention.

Overall, the present invention discloses an approach of coating a monolayer containing fluorine on surface of interfacial layer or on a gate layer. According to an embodiment of the present invention, coating of the monolayer could be accomplished by either treating the substrate with chemical solution or through an ALD process. For instance, by exposing the surface of the interfacial layer with chemical molecules from precursor selected from the group consisting of $CH_3FO_2$ and $C_2H_6FO_3P$, oxide trapping sites between interfacial layer and substrate or between interfacial layer and high-k dielectric layer could be filled to improve quality of the interfacial layer. This reduces the issue of flicker noise found in MOSFET devices and FinFETs substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate;
   forming an interfacial layer on the substrate;
   using a chemical solution to coat a monolayer containing fluorine on the interfacial layer; and
   forming a gate layer on the interfacial layer.

2. The method of claim 1, further comprising:
   forming a high-k dielectric layer on the interfacial layer after forming the monolayer containing fluorine;
   performing an anneal process; and
   forming the gate layer on the interfacial layer.

3. The method of claim 1, wherein the chemical solution comprises a precursor selected from the group consisting of $CH_3FO_2$ and $C_2H_6FO_3P$.

4. The method of claim 1, wherein the interfacial layer comprises silicon oxide.

5. The method of claim 1, wherein the gate layer comprises polysilicon.

* * * * *